PHASE-LOCKED FREQUENCY DIVIDER CIRCUIT

Filed Sept. 28, 1964

United States Patent Office 3,309,619

Patented Mar. 14, 1967

3,309,619

PHASE-LOCKED FREQUENCY DIVIDER CIRCUIT

Peter Schucht, Munich, Germany, assignor to Siemens & Halske Aktiengesellschaft Berlin and Munich, a corporation of Germany Filed Sept. 28, 1964, Ser. No. 399,717
Claims priority, application Germany, Sept. 30, 1963, S 87,652
5 Claims. (Cl. 331—17)

Various frequency divider circuits are known which make use of multivibrators, and have as their function the division of a constant frequency. It is also a known practice to operate frequency dividers with tunable filters within a narrow frequency range. Wide band frequency divided circuits which operate according to the counting chain principle can be used only where no demands are made on the side wave attenuation.

The invention is directed to the problem of creating a frequency divided which operates over a relatively wide frequency range without mechanical tuning means and, with high side wave attenuation, simultaneously achieves a great divider ratio in one step. The invention solves this problem by use of a frequency regulating circuit, in itself broadly known, consisting of a regulated oscillator to be synchronized to a reference frequency, a phase comparison circuit with a low pass filter lying in the regulating path and a locking circuit, in conjunction with the use of the following features:

(a) The regulated oscillator oscillates with a frequency (divider frequency) which differs from the reference frequency by the divider ratio.

(b) In a frequency multiplier lying in the regulating loop between the regulated oscillator and phase comparison circuit, the divider frequency is multiplied to the reference frequency fed to the phase comparison circuit.

(c) The low pass filter arranged in the regulating path consists of a series circuit of an LC low pass filter for the suppression of side waves and of an RC low pass filter with very low limit frequency.

(d) The RC low pass filter is provided with two phase shifting members which are connected respectively in parallel with the resistor and in series with the capacitance of the low pass filter.

(e) The inductance of the LC low pass filter is bridged by one diode or by two oppositely poled diodes.

This circuit makes possible a purely electronic frequency division over a wide frequency range, in which system, despite a very unfavorable frequency ratio of the pass range of the low pass filter in the regulating line, to the total frequency regulating range of the oscillator, not only is good stability of the regulating loop achieved, but also a high side wave attenuation.

According to an advantageous further development of the invention, the frequency multiplication of the oscillator frequency takes place in several stages, in such a way that harmonics of the oscillator frequency which are adjacent to the reference frequency to be divided can be easily suppressed by fixed filters.

Further details of the invention are explained with the aid of the drawings, in which.

The reference voltage produced in the generator G, which, for example, can have any frequency between 9–10 MC. is to be divided, for example, in the ratio of 10:1, the circuit also including a frequency regulated oscillator O with reactance circuit, a two-stage frequency multiplier V, a phase comparison circuit Ph, a low pass filter TP and a locking generator F. The frequency generated in the oscillator O, which differs from the output frequency of generator G by the desired divider ratio is multiplied in the frequency multiplier V to the reference frequency of generator G supplied by the latter to the phase comparison circuit Ph. If the frequency to be divided is taken from a frequency derivative circuit, side waves can be superimposed thereon to a high degree. A regulating voltage, obtained by phase comparison, controls over the low pass filter TP the reactance circuit of oscillator O and maintains its frequency (divider frequency), which can be tapped at output A, rigidly fixed.

The frequency multiplier V is constructed with two stages in order to enable the suppression of the 9th and 11th harmonics of the fundamental frequency of oscillator O by means of fixed filters. In the assumed multiplication of 1:10, the first stage can be a push-pull rectifier doubler, whose output over a two-circuit band filter controls a transistor connected at the output side. In the collector circuit of the transistor stage, over a further band filter, the 10th harmonic may be filtered out in the frequency range of 9–10 MC. With a greater expenditure in transistors a better stability of the multiplier circuit can be achieved by constructing the frequency multiplication for operation in reverse sequence; that is first quintupling the oscillator frequency and then doubling it.

As a result of the multiplication (tenfolding) of the oscillator frequency between oscillator O and the phase comparison circuit Ph, phase changes in the oscillator voltage reaching the phase comparison circuit Ph are also multiplied by ten. It is, therefore, no longer possible to stabilize the frequency divider with a low pass filter, such as is utilized in usual frequency regulating circuits. In order, however, to also be able to fulfill the requirements of the frequency divider with reference to side wave attenuation and phase disturbances, the low pass filter TP may comprise a series circuit of an LC and of an RC low pass filter.

Figure 1:
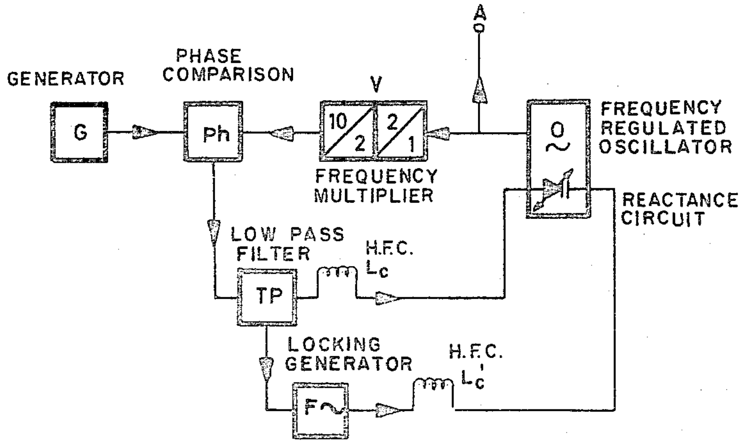
FIG. 1 is a block circuit diagram of a frequency divider circuit.
Figure 2:
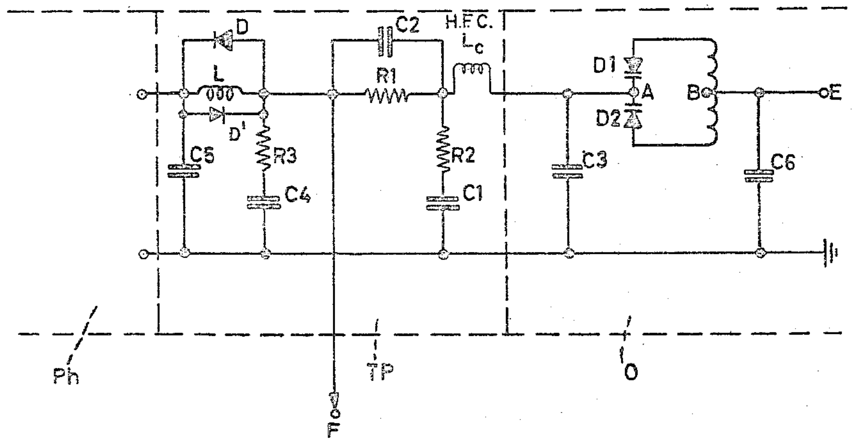
FIG. 2 is a circuit diagram illustrating in greater detail features of the circuit of FIG. 1.

The construction of the low pass filter will be described in greater detail with the aid of FIG. 2. The LC low pass filter, which is connected with the output of the phase comparison circuit Ph consists of the capacitance C5, the inductance L and the series circuit comprising the resistor R3 and the capacitance C4. Connected in parallel with the inductance L is a silicon diode D, the operation of which will be subsequently explained. The undesired harmonics of the oscillator frequency arising in the frequency multiplier V generate, with side waves, which may be superimposed on the frequency to be divided, differential oscillation in the phase modulator Ph which as their frequencies become lower are more difficult to suppress on the regulating line, so that these differential oscillations will be sufficiently attenuated at the output of the frequency divider A, the limit frequency of the LC low pass filter is as low as possible. The natural locking range given by this limit frequency of about 6 to 10 is, therefore, small. With frequency changes in the frequency to be divided, the voltage of the holding generator F forces the oscillator into this holding range. The LC low pass filter has, however, the disadvantage that it causes phase rotation through which the stability of the regulating circuit is unfavorably influenced.

The RC low pass filter connected at the output side of the LC low pass filter, comprises the resistor R1 and the capacitance C1. Although it is known that, by a large time constant of the RC low pass filter, both the stability and the side wave attenuation can be improved, the time constant is kept as small as the stability will permit, in order to improve the response sensitivity. Also for the locking process and the regulation involving small frequency variations, it is endeavored to achieve a time constant as small as possible. The necessary side wave attenuation is achieved through the LC low pass filter previously mentioned. Since, however, the LC low pass filter simultaneously impairs the stability phase-shifting members are introduced in the RC low pass filter, which consist of a condenser C2, which lies parallel to the resistor R1, and a small resistor R2 in series with the condenser C1. For the dimensioning of an RC low pass filter there can be given, for example, about the following values. In the RC member, R1=50 k. Ω, C1=1 μ F. From this there results, with $1/(\omega' \cdot C1)=R1$, a limit frequency of 3 c.p.s. The first phase shifting member consists of the capacitance C2 which extends parallel to the resistor R1. For $1/(\omega' \cdot C2) \ll R1$, the attenuation is proportional to C1/C2 and the phase again zero. The LC low pass filter requires a further phase shift, which is achieved through the resistor R2 in series with the capacitance C1. The combination R1·C2 and R2·C1 yields a Wien member which at about 1.4 kc. has a phase rotation of zero.

If in the oscillator resonant circuit there are used as reactance members one or two capacitance diodes which are characterized by a very high blocking resistance, it is then expedient to supply the regulating voltage over a high ohmic resistor, to effect a separation of the high frequency circuit from the regulating circuit. Such a resistor has, however, the disadvantage that phase disturbance of the oscillator at the necessary high regulating steepness is greatly increased. In order to avoid such disadvantage, high frequency chokes, such as the chokes $L_c$ and $L_c'$, can be used. The circuit according to the invention proceeds, however, from a reactance circuit, which uses two oppositely poled capacitance diodes D1, D2 and in which the center tap B of the oscillatory circuit inductance and the connecting point A of the two capacitance diodes are at ground potential with respect to high frequencies. The capacitance C3 blocks off residual high frequency voltages. The regulating voltage is supplied at point A, and the bias voltage for the capacitance diodes or the locking voltage at point B.

In frequency regulating oscillators with very great regulating steepness, such as is always present in the frequency divider circuit according to the invention, a so-called critical range can occur, which is characterized by the fact that with abrupt change of the oscillator frequency in the proximity of its own frequency the regulated oscillator is synchronized to an incorrect frequency and simultaneously the locking action of the locking generator does not take place. The term "its own frequency" is intended to designate the frequency at which the regulating voltage is zero.

In order to avoid such critical range in the locking function of the regulated oscillator, which, by interruption of the regulation, through brief change in operating voltage or in the switching on of the apparatus prevents the synchronizing of the oscillator and thereby impairs the operating reliability of the apparatus, there is provided a silicon diode D, which is connected in parallel with the inductance L of the LC low pass filter. This diode has the function of short circuiting the inductance L if relatively large alternating voltages (say 3 v.) of the differential frequency arise. In the synchronized state of the oscillator there are still present only very low voltages of the combination frequencies, which are smaller than the starting voltage of the silicon diode D, so that the inductance of the LC low pass filter is fully effective. In certain cases it is advantageous to connect in parallel with the inductance L two oppositely poled silicon diodes D and D.'

Instead of a silicon diode it is also possible to use another diode, for example, a germanium diode, if the starting characteristic corresponding to the silicon diode is derived artificially by a bias voltage.

Changes may be made within the scope and spirit of the appended claims which define what is believed to be new and desired to have protected by Letters Patent.

I claim:

1. In a frequency divider circuit, for a voltage whose frequency is variable over a wide range, for the achievement of a large divider ratio and high side-wave attenuation, utilizing a frequency regulating circuit consisting of an oscillator with a reactance circuit to be synchronized to a reference frequency, a phase comparison circuit to which the reference frequency is supplied, with a low pass filter disposed in the regulating circuit between said phase comparison circuit and said reactance circuit, and a locking circuit operatively disposed between said phase comparison circuit and said reactance circuit, the combination of:

(a) The regulated oscillator being constructed to oscillate at a frequency (divider frequency), which differs from the reference frequency by the divider ratio;

(b) A frequency multiplier operatively connecting the regulated oscillator and the phase comparison circuit, operative to multiply the divider frequency to the reference frequency supplied to the phase comparison circuit;

(c) The low pass filter arranged in the regulating circuit consists of a series circuit having an LC low pass filter for the suppression of side-waves and an RC low pass filter with very low limit frequency;

(d) The RC low pass filter is provided with two phase shifting members, one of which is connected in parallel with the resistance and one in series with the capacitance of the low pass filter;

(e) The inductance of the LC low pass filter is bridged by a diode having an initial conducting characteristic which is such that it is nonconductive under normal operation of the apparatus.

2. A frequency divider according to claim 1, wherein the inductance of the LC low pass filter is bridged by two parallelly connected diodes which are oppositely poled.

3. A frequency divider circuit according to claim 1, wherein the feed of the regulating and locking voltage to the reactance circuit takes place over HF chokes.

4. A frequency divider circuit according to claim 1, wherein the feed of the regulating and bias voltage takes place at points in the oscillator resonant circuit at ground potential with respect to high frequencies.

5. A frequency divider circuit for a voltage whose frequency is variable over a wide range and for the achievement of a large divider ratio and high side-wave attenuation, utilizing a frequency regulation circuit comprising a generator which produces the frequency which is to be divided, a frequency-regulated oscillator with a reactance circuit for producing the desired divider frequency, a phase comparison circuit having respective inputs to one of which said generator is operatively connected, a frequency multiplier disposed between and operatively connecting said oscillator with another input of said phase comparison circuit, said multiplier being operative to multiply the divider frequency to that of the frequency to be divided, said phase comparison circuit having an output, and a low pass filter circuit extending between and operatively connecting said output and said reactance circuit, completing a regulating loop:

(a) Said low pass filter circuit having filter means for suppressing side-waves, and filter means with a very low limit frequency;

(b) Said second mentioned filter means of said low pass filter having phase-shifting means therein for effecting a compensation occasioned by the presence of said first mentioned filter means of said low pass filter;

(c) Said first mentioned filter means of said low pass filter containing a diode connected in parallel with a part of such filter means, which diode has an initial operational conducting characteristic such that it is non-conductive under normal circuit operation, but in the presence of predetermined higher voltages is operative to substantially produce a short circuit across such part of the associated filter means.

References Cited by the Examiner

UNITED STATES PATENTS

| | | | |
|---|---|---|---|
| 2,725,476 | 11/1955 | Hugenholtz | 331—25 X |
| 2,843,740 | 7/1958 | Mantz et al. | 331—2 |
| 3,050,693 | 8/1962 | Sinniger | 331—36 X |

FOREIGN PATENTS

| | | |
|---|---|---|
| 9,744 | 4/1955 | Germany. |

ROY LAKE, *Primary Examiner.*

S. H. GRIMM, *Assistant Examiner.*